(12) United States Patent
Arase et al.

(10) Patent No.: US 7,867,563 B2
(45) Date of Patent: Jan. 11, 2011

(54) COMPONENT MOUNTING METHOD

(75) Inventors: Hidekazu Arase, Nara (JP); Tohru Nakagawa, Shiga (JP); Hiroyuki Masuda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/827,255

(22) Filed: Jun. 30, 2010

(65) Prior Publication Data

US 2010/0266769 A1 Oct. 21, 2010

Related U.S. Application Data

(63) Continuation of application No. PCT/JP2009/005191, filed on Oct. 6, 2009.

(30) Foreign Application Priority Data

Nov. 18, 2008 (JP) .............................. 2008-294118

(51) Int. Cl.
*H05K 3/10* (2006.01)
*H05K 3/20* (2006.01)
*H05K 3/30* (2006.01)

(52) U.S. Cl. .................. 427/266; 427/58; 427/96.1; 427/108; 427/140; 427/256; 427/258; 427/261; 427/265; 427/269; 427/287; 427/300; 29/831; 29/832; 29/834; 438/106; 438/107; 438/125; 438/126

(58) Field of Classification Search .................. 427/58, 427/96.1, 256, 258, 260, 261, 259, 265, 266, 427/264, 269, 271, 277; 438/106, 107, 125, 438/126; 29/831, 832, 834
See application file for complete search history.

(56) References Cited

U.S. PATENT DOCUMENTS 6,417,025 B1 7/2002 Gengel (Continued)

FOREIGN PATENT DOCUMENTS

JP 2003-005212 1/2003
JP 2007-059559 3/2007

(Continued)

OTHER PUBLICATIONS

Nakagawa, T., et al., "Controlled Deposition of Silicon Nanowires on Chemically Patterned Substrate by Capillary Force Using a Blade-Coating Method", J. Phys. Chem. C, 2008, pp. 5390-5396, vol. 112, American Chemical Society.

(Continued)

*Primary Examiner*—Michael Cleveland
*Assistant Examiner*—Lisha Jiang
(74) *Attorney, Agent, or Firm*—McDermott Will & Emery LLP

(57) ABSTRACT

The present invention is a method of mounting a plurality of components on a substrate. This component mounting method comprises the steps of (a) to (f): (a) preparing the substrate; (b) preparing a first liquid; (c) preparing a component-containing liquid containing the components and a second liquid, wherein the first liquid is insoluble in the second liquid and has a higher wettability than the second liquid with respect to the surfaces of the components, first regions, and a line having a shorter width than a minimum length of each of the components; (d) disposing the first liquid in the first regions and the line; (e) moving a squeegee for supplying a component-containing liquid to the substrate, relative to the substrate over the line from one edge to the other edge of the substrate to bring the component-containing liquid into contact with the first liquid disposed in the first regions; and (f) removing the first liquid and the second liquid from the substrate to dispose the components in the first regions.

12 Claims, 9 Drawing Sheets

U.S. PATENT DOCUMENTS

| | | |
|---|---|---|
| 6,507,989 B1 | 1/2003 | Bowden et al. |
| 6,872,645 B2 | 3/2005 | Duan et al. |
| 6,969,690 B2 | 11/2005 | Zhou et al. |
| 2008/0293175 A1 | 11/2008 | Torii |
| 2009/0265929 A1* | 10/2009 | Nakagawa et al. ............ 29/846 |

FOREIGN PATENT DOCUMENTS

| | | |
|---|---|---|
| JP | 4149507 | 7/2008 |
| WO | WO 2007/037381 A1 | 4/2007 |
| WO | WO 2007/105405 A1 | 9/2007 |

OTHER PUBLICATIONS

Srinivasan, U., et al., "Microstructure to Substrate Self-Assembly Using Capillary Forces", Journal of Microelectromechanical Systems, Mar. 2001, pp. 17-24, vol. 10 No. 1, IEEE.

Wang, D., et al., "Germanium nanowire field-effect transistors with $SiO_2$ and high-κ $HfO_2$ gate dielectrics", Applied Physics Letters, Sep. 22, 2003, pp. 2432-2434, vol. 83 No. 12, American Institute of Physics.

Huang, Y., et al., "Directed Assembly of One-Dimensional Nanostructures into Functional Networks", Science, Jan. 26, 2001, pp. 630-633, vol. 291.

Lienemann, J., et al., "Modeling, Simulation, and Experimentation of a Promising New Packaging Technology: Parallel Fluidic Self-Assembly of Microdevices", Sensors Update, 2004, pp. 3-43, vol. 13.

Drobac, S., et al., "Fluidic Self-Assembly Could Change the Way FPDs Are Made", Information Display, 1999, pp. 12-16, SID.

* cited by examiner

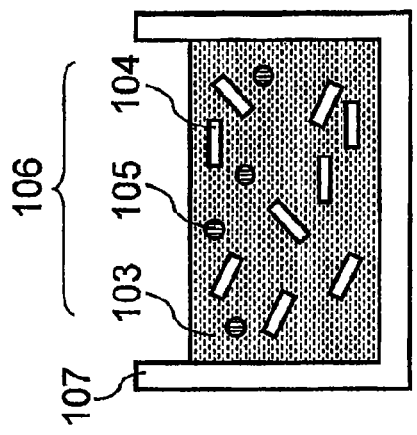
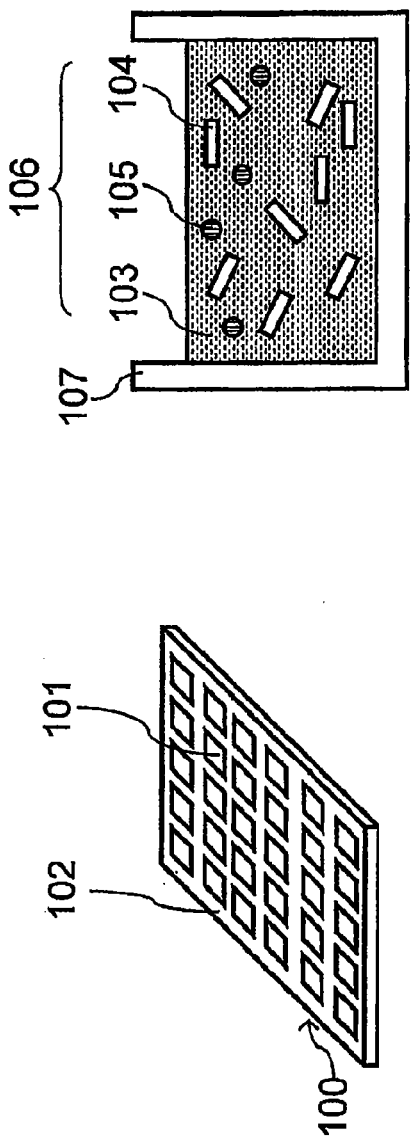
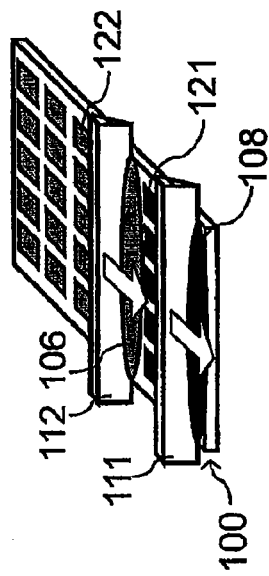
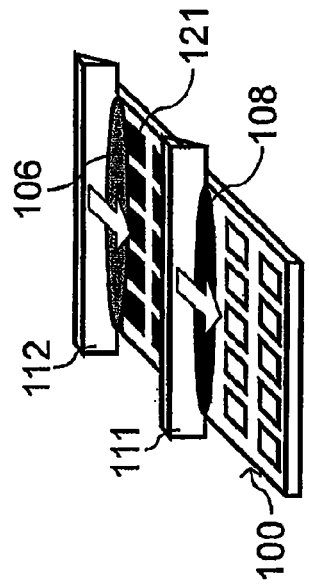
FIG.9A PRIOR ART
FIG.9B PRIOR ART
FIG.9C PRIOR ART
FIG.9D PRIOR ART

COMPONENT MOUNTING METHOD

This Application is a continuation of International Application No. PCT/JP2009/005191, whose international filing date is Oct. 6, 2009 which in turn claims the benefit of Japanese patent application Ser. No. 2008-294118, filed on Nov. 18, 2008, the disclosures of which Applications are incorporated by reference herein.

BACKGROUND OF THE INVENTION

1. Field of the Invention

The present invention relates to a component mounting method.

2. Description of Related Art

Active-type liquid crystal display devices and organic electroluminescence display devices are formed on glass substrates. Pixels that are arranged in a matrix on the substrate are each controlled by a transistor placed in the vicinity of the pixel. With current technology, however, crystalline semiconductor transistors cannot be formed on a glass substrate. Therefore, thin film transistors formed using amorphous silicon or polysilicon thin films are used for the control of pixels. Such thin film transistors have the advantage that they can be fabricated on a large-area substrate at low cost. They, however, have the disadvantage that their lower mobility than crystalline silicon prevents them from operating at high speed. To overcome this disadvantage, there have been conventionally proposed techniques in which a large number of transistors are fabricated on a silicon wafer previously and then cut into individual pieces to be disposed on a substrate.

As shown in FIG. 9A, in U.S. patent application Ser. No. 12/088,194, now U.S. Pat. No. 7,730,610 first, a substrate 100 comprising a plurality of hydrophilic regions 101 and a water-repellent region 102 formed to surround the plurality of hydrophilic regions 101 is prepared. Next, a component-containing liquid 106 contained in a container 107, as shown in FIG. 9B, is prepared. Specifically, components 104 to be disposed on the substrate 100 are dispersed in a solvent 103, which is substantially insoluble in water, to prepare the component-containing liquid 106. One of the surfaces of the component 104 is hydrophilic and is to be bonded to the substrate 100, and the other surfaces of the component 104 are water-repellent.

Next, as shown in FIG. 9C, water 108 is disposed in the plurality of hydrophilic regions 101 by using a first squeegee 111. In the diagrams, the reference numeral 121 denotes the water that has been disposed in the hydrophilic regions 101. Subsequently, as shown in FIG. 9D, the component-containing liquid 106 in which the components 104 are dispersed is applied by using a second squeegee 112 to bring the component-containing liquid 106 into contact with the water 121 disposed in the hydrophilic regions 101. In the diagrams, the reference numeral 122 denotes the component-containing liquid that has been disposed in the hydrophilic regions 101. During this process, the components 104 move into the water 121 disposed in the hydrophilic regions 101. Then, the water 121 and the solvent 103 contained in the component-containing liquid 106 are removed to fix the components 104 onto the hydrophilic regions 101 on the substrate 100.

SUMMARY OF THE INVENTION

The method described in U.S. patent application Ser. No. 12/088,194 now U.S. Pat. No. 7,730,610 is an excellent method of disposing components on a substrate. In this method, however, foreign objects 105 smaller in volume than the components 104 to be mounted (hereinafter also referred to simply as "minute foreign objects") may get mixed in the component-containing liquid 106 during the process of preparing the component-containing liquid 106, as shown in FIG. 9B. In this case, the effect of the interfacial tension acting on the minute foreign object 105 is greater than the effect of the interfacial tension acting on the component 104. Therefore, the minute foreign objects 105 also are disposed in the hydrophilic regions 101 in which the components 104 are to be disposed. Accordingly, there has been a problem in that the minute foreign objects 105 disposed in the hydrophilic regions 101 in which the components 104 are to be disposed may serve as an obstacle and cause adverse effects (such as an electrical connection failure) on the characteristics of a device to be fabricated.

The present invention has been made in order to solve the above problem, and it is an object of the present invention to provide a method of mounting components at predetermined positions on a substrate accurately and with good reproducibility even when minute foreign objects get mixed in a component-containing liquid containing the components during mounting of the components on the substrate.

In order to solve the above conventional problem, a component mounting method of the present invention is a method of mounting a plurality of components on a substrate. This method comprises the steps of (a) to (f):

(a) preparing the substrate comprising a plurality of first regions, a second region, and a line, wherein the second region surrounds the plurality of first regions and the line, the line is provided on a side of and along one edge of the substrate an/d has a shorter width than a minimum length of each of the components, and each of the first regions has the same shape and size as mounting surfaces of the components that are to be brought into contact with the substrate;

(b) preparing a first liquid;

(c) preparing a component-containing liquid containing the components and a second liquid, wherein the first liquid is insoluble in the second liquid and has a higher wettability than the second liquid with respect to the surfaces of the components, the first regions, and the line;

(d) disposing the first liquid in the first regions and the line;

(e) moving a squeegee relative to the substrate over the line from the one edge to the other edge of the substrate to bring the component-containing liquid into contact with the first liquid disposed in the first regions, the squeegee supplying the component-containing liquid to the substrate; and (f) removing the first liquid and the second liquid from the substrate to dispose the components in the first regions.

In this specification, the term "mounting" is intended to encompass "packaging". In the specification, the "component" is, for example, an electronic component.

According to the method of the present invention, even when minute foreign objects get mixed in the component-containing liquid in which the components are dispersed, such minute foreign objects are removed in the line. Therefore, there are a reduced number of minute foreign objects in the first regions in which the components are to be mounted. Accordingly, a device to be fabricated is not subject to adverse effects (such as an electrical connection failure). Furthermore, an apparatus or an operation for removing minute foreign objects can be simplified or omitted, and a step of removing minute foreign objects also can be omitted. As a result, the manufacturing cost can be reduced.

BRIEF DESCRIPTION OF THE DRAWINGS

FIG. 9A, FIG. 9C, and FIG. 9D are perspective views schematically showing respective steps in a mounting method described in U.S. patent application Ser. No. 12/088,194, now U.S. Pat. No. 7,730,610 and FIG. 9B is a cross-sectional view schematically showing a component-containing liquid used in this mounting method.

DETAILED DESCRIPTION OF THE INVENTION

Figure 1A:
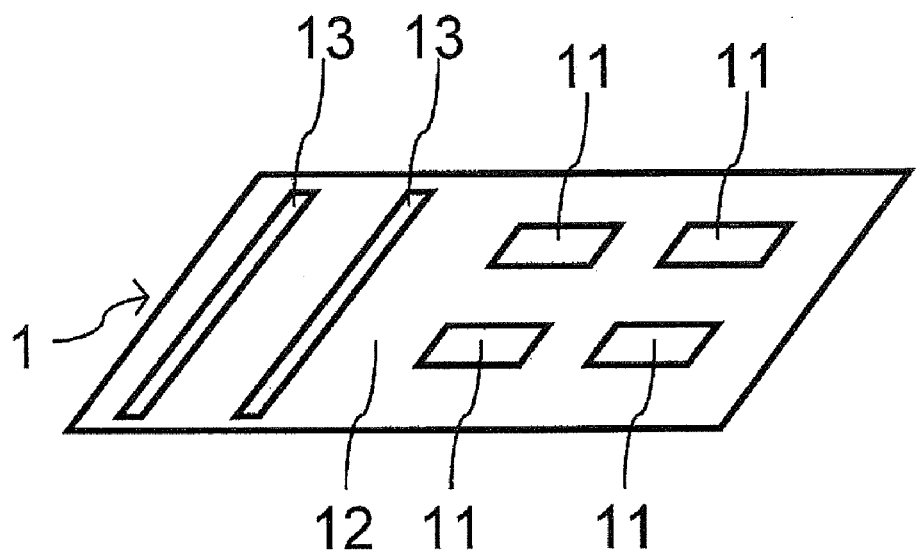
FIG. 1A and FIG. 1B are perspective views showing an example of first regions, a second region, and lines in a mounting method of the present invention.

Hereinafter, an embodiment of the mounting method of the present invention will be described in detail with reference to the accompanying drawings. In the drawings referred to in the description below, cross-hatching is omitted in some cases for clarity. In the following description, the same reference numerals are used to designate the same elements and parts, and overlapping description thereof is omitted in some cases.

Figure 1B:
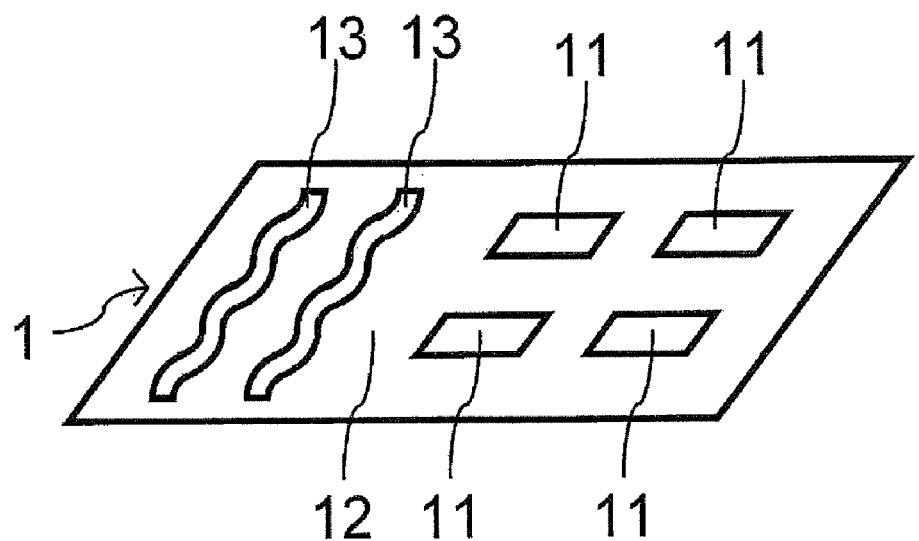
Figure 2:
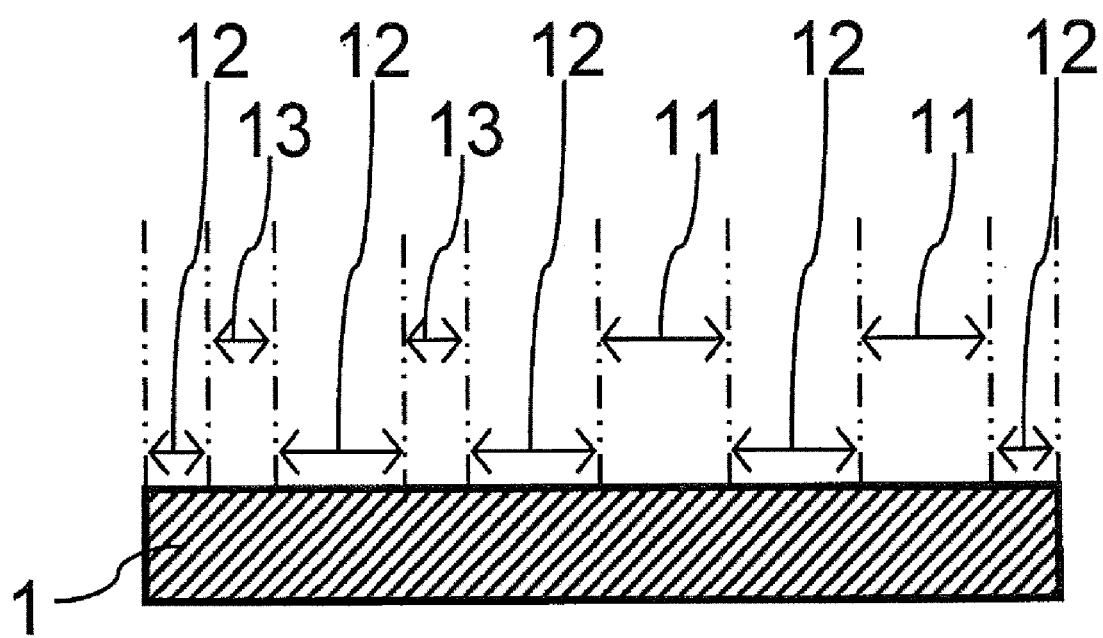
FIG. 2 is a cross-sectional view showing the example of the first regions, the second region, and the lines in the mounting method of the present invention.

FIG. 1A and FIG. 1B are perspective views showing an example of first regions 11, a second region 12, and lines 13 in the mounting method of the present invention. FIG. 2 is a cross-sectional view showing the example of the first regions 11, the second region 12, and the lines 13 in the mounting method of the present invention. In the following, an embodiment is described by taking water as a specific example of a first liquid.

In the present embodiment, first, a substrate 1 as shown in FIG. 1A, FIG. 1B, and FIG. 2 is prepared. The first regions 11, the second region 12, and the lines 13 are provided on this substrate 1. The second region 12 surrounds the first regions 11 and the lines 13. The first regions 11, the second region 12, and the lines 13 are formed so that the first regions 11 and the lines 13 have a higher wettability than the second region 12 with respect to water. Specifically speaking, the first regions 11 and the lines 13 are hydrophilic, and the second region 12 is water-repellent. The lines 13 are provided on the side of and along one edge of the substrate 1. The first regions 11 are disposed on the side of the other edge of the substrate 1 with respect to the lines 13 (i.e., the side opposite to the side on which the lines 13 are provided).

Figure 3:
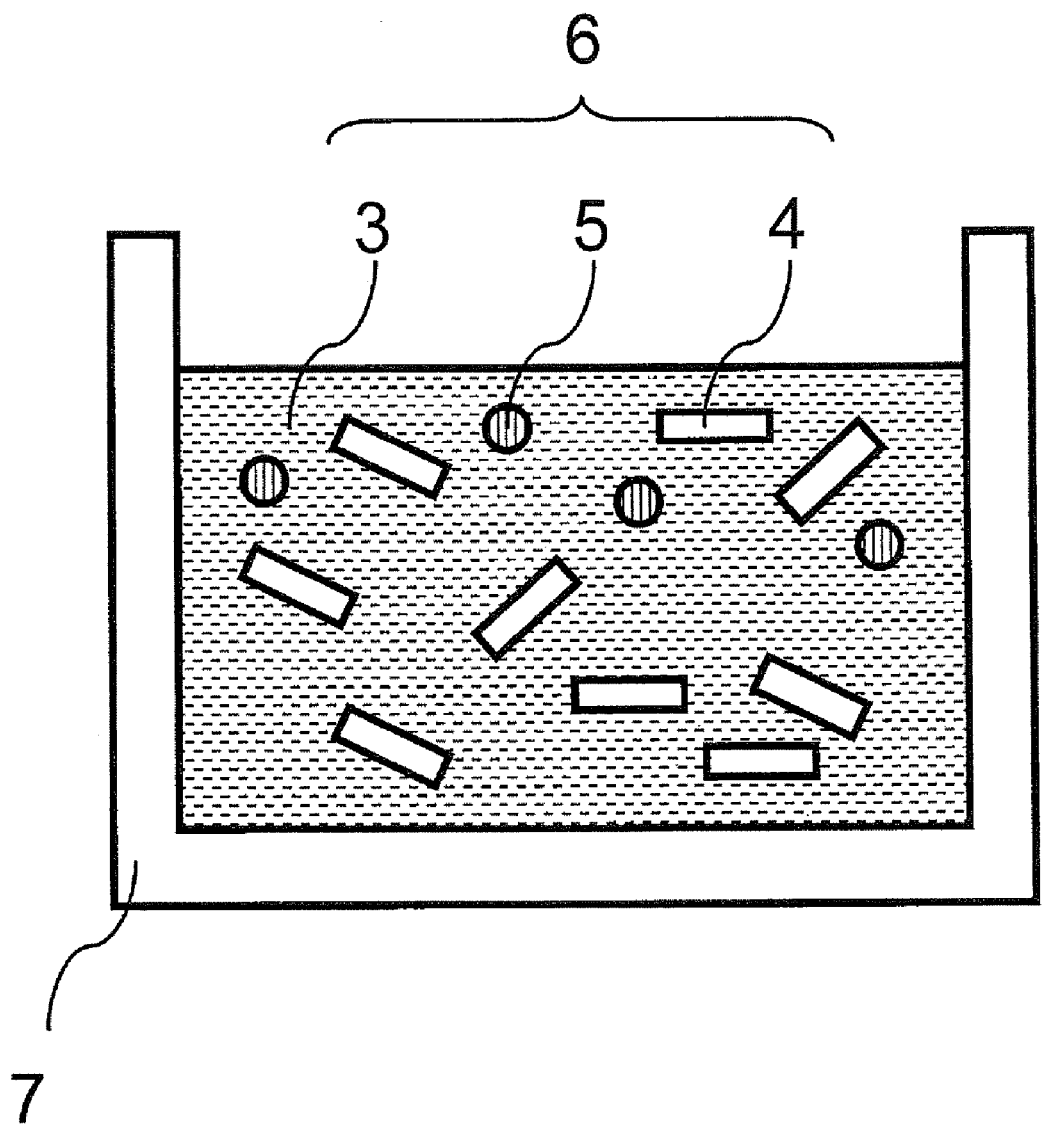
FIG. 3 is a cross-sectional view schematically showing a component-containing liquid in the mounting method of the present invention.

In the mounting method of the present embodiment, water is prepared as a first liquid (Step (b)), and then a component-containing liquid is prepared (Step (c)). FIG. 3 is a cross-sectional view schematically showing a component-containing liquid used in the mounting method of the present embodiment. FIG. 3 illustrates a component-containing liquid 6 in a container 7. The component-containing liquid 6 contains a second liquid 3, components 4 dispersed in the second liquid 3, and minute foreign objects 5. Water is substantially insoluble in the second liquid 3. A specific example of the second liquid 3 is hexane. Other specific examples of the second liquid 3 will be described later. As used in this specification, the term "dispersed" refers to a state in which the components 4 do not agglomerate in the second liquid 3. The component-containing liquid 6 may be stirred to disperse the components 4 therein.

Next, a step of disposing water on the substrate 1 (Step (d)) is described with reference to FIG. 4A to FIG. 4D.

Figure 4B:
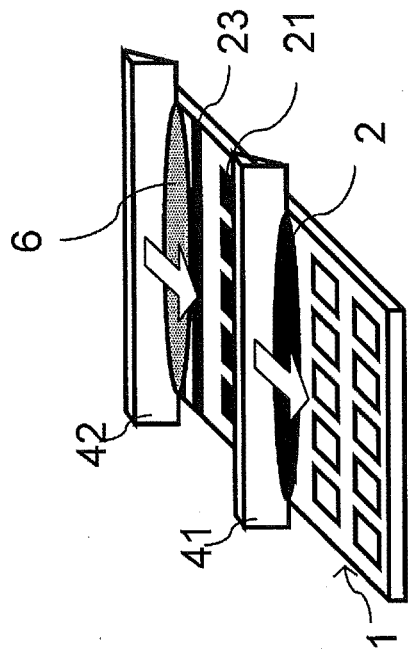
FIG. 4A, FIG. 4B, and FIG. 4D are perspective views schematically showing a step of disposing a first liquid in the mounting method of the present invention.
Figure 4D:
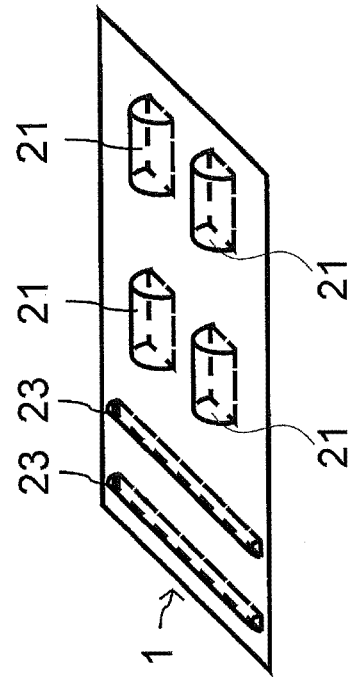
Figure 4A:
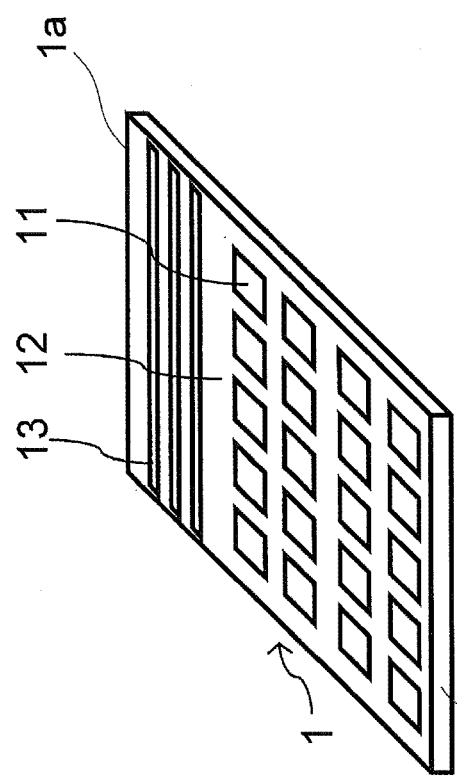

FIG. 4A is a perspective view of the substrate 1. One main surface of the substrate 1 is provided with the first regions 11, the lines 13, and the second region 12 that surrounds the first regions 11 and the lines 13. The lines 13 are provided on the side of and along one edge (edge 1a) of the substrate 1.

FIG. 4B is a perspective view showing an example of the configuration and operation of a mounting apparatus for carrying out the mounting method of the present invention. As shown in FIG. 4B, in the mounting apparatus used in the present embodiment, a first squeegee 41 for exposing the substrate 1 to the water (first liquid) 2 and a second squeegee 42 for exposing the substrate 1 to the component-containing liquid 6 are placed at a predetermined distance, and these two squeegees are moved with the distance maintained therebetween. Means for fixing and moving the squeegees 41 and 42 are not shown in the diagrams.

In the mounting method of the present embodiment, first, the first squeegee 41 is moved relative to the substrate 1 to bring the substrate 1 into contact with the water 2, and as a result, the water is disposed only in the first regions 11 and the lines 13. In the diagrams, the reference numeral 21 denotes the water that has been disposed in the first regions 11, and the reference numeral 23 denotes the water that has been disposed in the lines 13. In the diagrams, arrows indicate the direction of the relative movement of the squeegee 41 with respect to the substrate 1. In the present embodiment, as shown in FIG. 4B, the first squeegee 41 is used to dispose the water in the first regions 11 and the lines 13. The substrate 1 may be immersed in a container containing water and pulled out of the container to dispose the water in the first regions 11 and the lines 13.

Figure 4C:
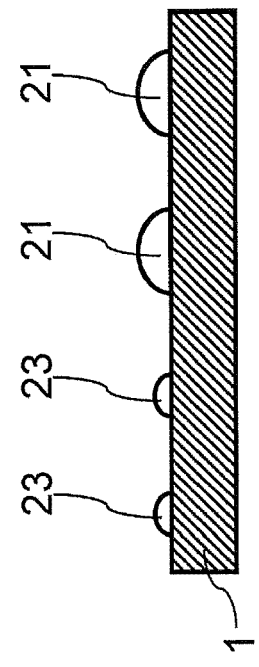
FIG. 4C is a cross-sectional view showing the step of disposing the first liquid in the mounting method of the present invention.

FIG. 4C is a cross-sectional view schematically showing the water 21 disposed in the first regions 11 and the water 23 disposed in the lines 13, and FIG. 4D is a perspective view schematically showing the water 21 disposed in the first regions 11 and the water 23 disposed in the lines 13. Since the first regions 11 and the lines 13 are surrounded by the second region 12 having a lower wettability to water (see FIG. 4A), the water 21 disposed in the first regions 11 and the water 23 disposed in the lines 13 do not easily spread out of the first regions 11 and the lines 13 respectively. As a result, the contact surfaces of the water and the substrate 1 have almost the same shapes as the first regions 11 and the lines 13.

Next, steps of disposing components on the substrate (Step (e) and Step (f)) are described with reference to FIG. 5A to FIG. 5D.

Figure 5A:
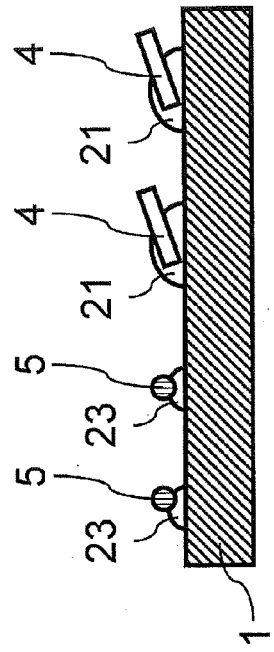
FIG. 5A and FIG. 5D are perspective views schematically showing steps of disposing the components in the mounting method of the present invention.
Figure 5B:
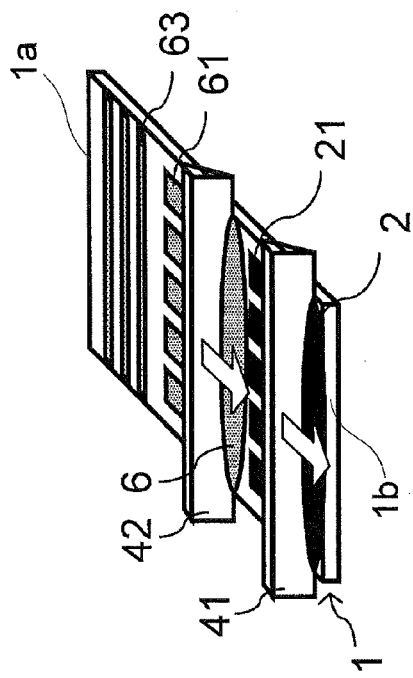
FIG. 5B and FIG. 5C are cross-sectional views schematically showing the steps of disposing the components in the mounting method of the present invention.

As shown in FIG. 5A, the second squeegee 42 is moved from the one edge side of the substrate 1 (the far side in FIG. 5A, that is, the side of the edge 1a) to the other edge side (the near side in FIG. 5A, that is, the side of the edge 1b) to expose the substrate 1 to the component-containing liquid 6. The component-containing liquid 6 first passes over the lines 13 and then passes over the first regions 11. The reference numeral 61 denotes the component-containing liquid that has been disposed in the first regions 11 and the reference number 63 denotes the component-containing liquid that has been disposed in the lines 13. The water 2 is substantially insoluble in the second liquid 3 that constitutes the component-containing liquid 6. Therefore, the water 21 disposed in the first regions 11 and the water 23 disposed in the lines 13 stay stably in the first regions 11 and the lines 13 respectively (see FIG. 4C and FIG. 4D). During this process, as shown in FIG. 5B, the components 4 move into the water 21 disposed in the first regions 11 by the interfacial tension that acts on the components 4. The minute foreign objects 5 move into the water 23 disposed in the lines 13 by the interfacial 25 tension that acts on the minute foreign objects 5.

Figure 5C:
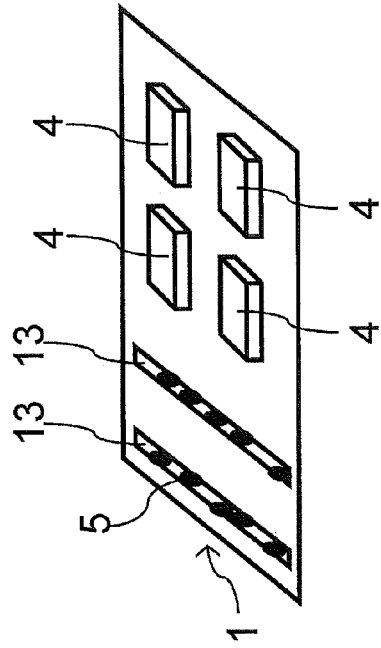
Figure 5D:
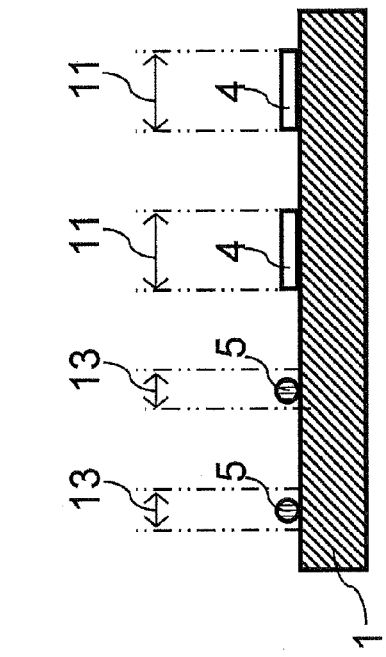

Next, the water 21, the water 23 and the component-containing liquid 6 (the second liquid 3 in which the components 4 are dispersed) are removed from one main surface of the substrate 1. As shown in FIG. 5C and FIG. 5D, the components 4 are disposed in the first regions 11, and the minute foreign objects 5 are disposed in the lines 13.

As described above, the formation of the first regions 11 and the lines 13 surrounded by the second region 12 allows the water to be disposed accurately in the first regions 11 and the lines 13. As a result, the minute foreign objects 5 are disposed in the lines 13, which allows the minute foreign objects 5 to be removed from the component-containing liquid 6. That is, the component-containing liquid 6 first contacts the water 23 in the lines 13 and most of the minute foreign objects 5 move into the water 23 in the lines 13. Accordingly, the component-containing liquid 6 from which most of the minute foreign objects 5 have been removed are brought into contact with the water 21 in the first regions 11, which allows the components 4 to be disposed accurately in the first regions 11.

Hereinafter, the removal of the minute foreign objects 5 will be described in more detail with reference to FIG. 4A to FIG. 4D and also FIG. 5A to FIG. 5D.

The mounting method of the present invention is characterized in that the lines 13 surrounded by the second region 12 are provided on the one edge side of the substrate 1 for the purpose of removing the minute foreign objects 5. As shown in FIG. 1A and FIG. 1B, the lines 13 may be linear or curved in shape. The number of the lines 13 may be one or two or more. Preferably, the number of the lines 13 is 100 to 1000 to remove the minute foreign objects 5 more effectively. When two or more lines 13 are provided, they may be different in shape from one another.

In the mounting method of the present invention, the width of the line 13 is shorter than the minimum length of the component 4 to be mounted. In the mounting method of the present invention, the width of the line 13 is adjusted to adjust the volume of the water 23 to be disposed in the line 13. With an increase in the width of the line 13, the volume of the water 23 to be disposed in the line 13 increases. On the other hand, with a decrease in the width of the line 13, the volume of the water 23 to be disposed in the line 13 decreases. The volume of the water 23 to be disposed in the line 13 is adjusted to restrict the size of an object to be disposed in the line 13, which prevents the component 4 from being disposed in the line 13.

The line 13 having a width shorter than the minimum length of the component 4 to be mounted is provided to adjust the volume of the water 23 to be disposed in the line 13. As a result, only the minute foreign objects 5 contained in the component-containing liquid 6 are moved from the component-containing liquid 6 into the water 23 disposed in the line 13 and thus are disposed in the line 13. That is, the line 13 allows the minute foreign objects 5 contained in the component-containing liquid 6 to be removed therefrom. Accordingly, in the mounting method of the present invention, the number of minute foreign objects 5 to be disposed in the first regions 11 can be reduced significantly compared with the case where the line 13 is not provided.

The present inventors have conducted experiments and found out that when the width of the line 13 is longer than the minimum length of the component 4 to be mounted (the length of the shortest side of the mounting surface of the component 4 to be brought into contact with the substrate 1), the volume of the water 23 to be disposed in the line 13 increases excessively, which results in the disposition of not only the minute foreign objects 5 but also the component 4 in the line 13.

Therefore, the width of the line 13 has to be shorter than the minimum length of the component 4, and more preferably, it is shorter than half the length of the minimum length of the component 4.

Here, the "minimum length of the component to be mounted" will be described in detail with reference to FIG. 6A to FIG. 6D.

Figure 6B:
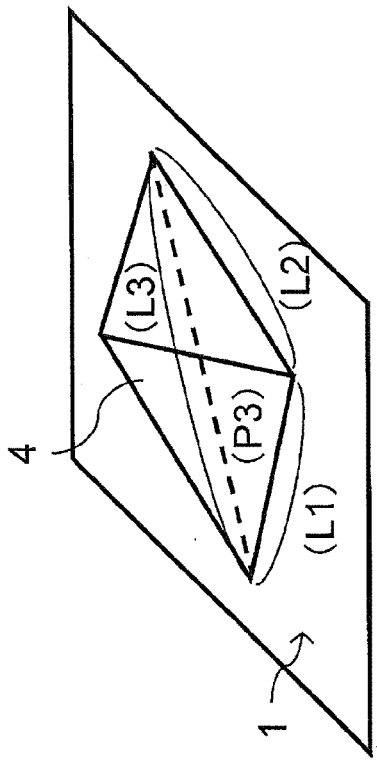
FIG. 6A to FIG. 6D are perspective views illustrating the minimum lengths of the components in the mounting method of the present invention.
Figure 6D:
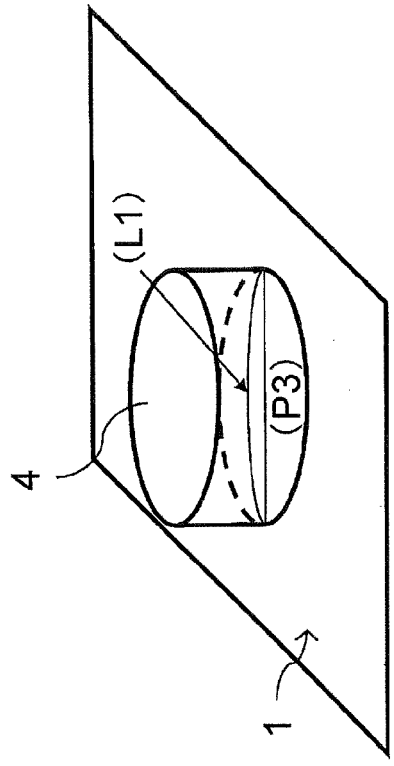
Figure 6A:
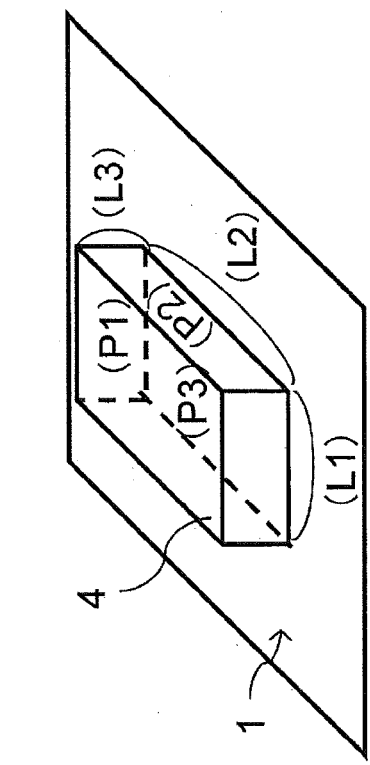

When the component 4 is a rectangular parallelepiped comprising a pair of surfaces (P1), a pair of surfaces (P2) each having an area equal to or larger than the surface (P1), and a pair of surfaces (P3) each having a larger area than the surface (P2), as shown in FIG. 6A, the lengths of the sides of the rectangular parallelepiped are denoted as (L1), (L2), and (L3) respectively. When the shape and size of the first region 11 is the same as those of the surface (P3), the component 4 is disposed so that the one of the surfaces (P3) faces the surface of the substrate 1 on which the first region 11 is provided. In this case, the "minimum length of the component to be mounted" refers to the length (L1) of the shortest side among the lengths (L1) and (L2) of the sides that form the mounting surface (P3) to be brought into contact with the substrate. What "the same shape and size" means in this specification will be described later.

When the surface (P3) of the component 4 to be disposed to face the first region 11 of the substrate 1 has a triangular shape, as shown in FIG. 6B, the "minimum length of the component to be mounted" refers to the length (L1) of the shortest side among the lengths (L1), (L2), and (L3) of the sides that form the triangle.

Figure 6C:
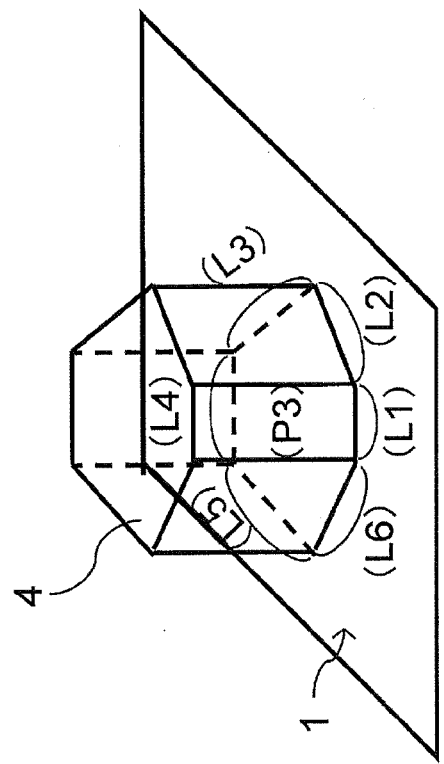

When the surface (P3) of the component 4 to be disposed to face the first region 11 of the substrate 1 has a hexagonal shape, as shown in FIG. 6C, the "minimum length of the component to be mounted" refers to the length (L1) of the shortest side among the lengths (L1) to (L6) of the sides that form the hexagon.

When the surface (P3) of the component 4 to be disposed to face the first region 11 of the substrate 1 has a circular shape, as shown in FIG. 6D, the "minimum length of the component to be mounted" refers to the length (L1) of the diameter of the surface (P3). In the case of an ellipse, it means the shorter diameter.

Preferably, the minimum length of the component 4 to be mounted is at least 10 µm. When the component 4 is a rectangular parallelepiped comprising the surfaces (P1), the surfaces (P2), and the surfaces (P3), the long side (the side having the length (L2) in FIG. 6A) of the mounting surface (P3) to be brought into contact with the substrate preferably has a length of 1000 μm or less.

Next, the movement of the squeegees in the mounting method of the present invention will be described in detail.

In the mounting method of the present embodiment, first, as shown in FIG. 4B, the first squeegee for supplying water to the substrate 1 is moved on and relative to the substrate 1 to dispose the water in the first regions 11 and the lines 13. Then, as shown in FIG. 5A, the second squeegee 42 for supplying the component-containing liquid 6 to the substrate 1 is moved on and relative to the substrate 1 over the lines 13 (across the lines) from the one edge side as a starting point, on which the lines 13 are formed (the far side in FIG. 5A, that is, the side of the edge 1a), to the other edge side (the near side in FIG. 5A, that is, the side of the edge 1b). The second squeegee 42 is moved in this manner to bring the component-containing liquid 6 into contact first with the water 23 disposed in the lines 13 (see FIG. 4B).

At this time, interfacial tension acts on the components 4 in the component-containing liquid 6 and on the minute foreign objects 5 mixed in the component-containing liquid 6 in the direction of drawing them into the water 23. Since the minute foreign objects 5 are smaller in volume than the components 4, the effect of the interfacial tension acting on the minute foreign objects 5 is greater than the effect of the interfacial tension acting on the components 4. In more detail, the forces other than the interfacial tension act on the minute foreign objects 5 and the components 4, and the minute foreign objects 5 are less affected by the forces other than the interfacial tension than the components 4 because of their much smaller size than the components 4. As a result, the minute foreign objects 5 are affected more significantly by the interfacial tension. For this reason, the minute foreign objects 5 move more easily into the water 23 than the components 4. Accordingly, the minute foreign objects 5 move into the water 23 (see FIG. 5B) and are disposed in the lines 13 on the substrate 1 (see FIG. 5C). As a result, the number of the minute foreign objects 5 in the component-containing liquid 6 is smaller after the component-containing liquid 6 passes over the lines 13 than that before it passes over the lines 13.

Then, the second squeegee 42 is moved relative to the substrate 1 toward the other edge side of the substrate 1. As a result, the component-containing liquid 6 contacts the water 21 disposed in the first regions. Interfacial tension acts on the components 4 in the component-containing liquid 6 in the direction of drawing the components 4 into the water 21. This interfacial tension moves the components 4 into the water 21 (see FIG. 5B). Then, the components 4 are disposed in the first regions 11 on the substrate 1 (see FIG. 5C).

In the mounting method of the present invention, the second squeegee 42 is moved relative to the substrate 1 over the lines from the one edge side to the other edge side of the substrate 1. As stated herein, the phrase "moving relative to the substrate 1 over the lines from the one edge side to the other edge side" refers to the following operation. As shown in FIG. 4A and FIG. 4B, the second squeegee 42 is prepared at a position on the one edge side of the substrate 1 on which the lines 13 are formed (the far side in FIG. 4A, that is, the side of the edge 1a). Then, the second squeegee 42 is moved on the substrate 1 toward the other edge side on which the first regions 11 are formed (the near side in FIG. 4A, that is, the side of the edge 1b). That is, the second squeegee 42 first is moved to pass over the lines 13. Then, the second squeegee 42 is moved continuously without changing the moving direction toward the other edge side until it reaches the second region 12 on which the line 13 is not formed. The second squeegee 42 is moved continuously to the other edge side of the substrate 1 to pass over the first regions 11. A description has been given on the assumption that the squeegees 41 and 42 are moved and the substrate 1 is not moved, but the substrate 1 may be moved without moving the squeegees 41 and 42. Both of the squeegees 41 and 42 and the substrate 1 may be moved. In the mounting method of the present invention, the squeegees 41 and 42 are moved relative to the substrate 1 in any of the manners described above.

In the present embodiment, the first squeegee 41 and the second squeegee 42 are placed at a predetermined distance, as shown in FIG. 4B and FIG. 5A, and these two squeegees 41 and 42 are moved with the distance maintained therebetween. Therefore, the first squeegee 41 moves in the same manner as the second squeegee 42.

As has been described above, the width of the line 13 is shorter than the minimum length of the component 4, and the second squeegee 42 for supplying the component-containing liquid 6 to the substrate 1 is moved relative to the substrate 1 over the lines 13 from the one edge side to the other edge side of the substrate 1. Accordingly, the minute foreign objects 5 mixed in the component-containing liquid 6 are disposed in the lines 13 before they are disposed in the first regions 11. As a result, the number of the minute foreign objects 5 mixed in the component-containing liquid 6 is reduced compared to that when the squeezing starts (before the component-containing liquid 6 passes over the lines 13). In this way, the number of the minute foreign objects 5 to be disposed in the first regions 11 can be reduced.

In the present embodiment, as shown in FIG. 4A, the first regions 11 and the lines 13 having a higher wettability to water are surrounded by the second region 12 having a lower wettability to water on the substrate 1. In order to obtain the first regions 11, the second region 12, and the lines 13 having such different degrees of wettability, the first regions 11, the second region 12, and the lines 13 are formed so that the second region 12 has a lower surface energy than the first regions 11 and the lines 13.

Since the first regions 11, the second region 12, and the lines 13 are provided in such a manner, the water disposed in the first regions 11 and the water disposed in the lines 13 stay in the first regions (as the water 21) and the lines (as the water 23), as shown in FIG. 4D, without spreading out of the first regions 11 and the lines 13.

In order to dispose the water more stably in the first regions 11 and the lines 13, it is preferable that there be a significant difference between the wettability of the first regions 11 and the lines 13 to water and the wettability of the second region 12 to water.

In the present embodiment, a description has been given assuming that the first regions 11 have the same surface energy as the lines 13. The surface energy of the first regions 11 may be different from that of the lines 13 as long as the surface energy of the second region 12 is lower than that of the first regions 11 and that of the lines 13.

The wettability of water with respect to a solid surface is related not only to the surface energy of the solid but also the surface tension of the water, and as such the value of the surface energy of the solid, which is the indicator of either "hydrophilicity" or "water repellency", is not particularly limited. However, the surface energy preferably is 40 mJ/m$^2$ or greater (preferably 60 to 1000 mJ/m$^2$) when the surface is "hydrophilic" and at least 5 mJ/m$^2$ but less than 40 mJ/m$^2$ (preferably 5 to 25 mJ/m$^2$) when the surface is "water-repellent".

A hydrophilic substrate or a substrate that has been subjected to hydrophilic treatment is prepared previously and a water-repellent film is formed in a portion in which the second region 12 is to be formed, so that the first regions 11 and the lines 13 surrounded by the second region 12 can be formed. For example, a portion of the substrate where hydrophilicity is required is covered with a protective film such as a resist. Next, the substrate entirely is covered with a water-repellent film, and then the protective film is removed to remove the water-repellent film formed in the first regions 11 and the lines 13. This method is applicable when the film is formed using a silane coupling agent or a sol-gel method. Alternatively, a surface, on which only a water-repellent film specifically adheres, may be formed in a portion of the substrate in which the second region is to be formed to form the water-repellent film only in that portion. For example, a metal pattern that reacts with thiol is formed only in a portion of the substrate where water repellency is required, and the substrate is immersed in an organic solvent in which thiol is dissolved. In this way, water repellency can be imparted to only the metal region.

A water repellent film may be formed directly in a predetermined region by methods such as ink jet printing, screen printing, relief printing, intaglio printing, and microcontact printing.

The hydrophilic first regions 11 and lines 13 may be formed using inorganic materials. For example, since the silicon substrate has higher water repellency than silicon oxide, patterns of a silicon oxide film may be formed on the surface of the silicon substrate to provide this patterned silicon oxide film as the first regions 11 and/or the lines 13. According to this configuration, water can be disposed only on the patterned silicon oxide film. The silicon oxide film may be formed, for example, by depositing a silicon oxide film by plasma CVD, or by oxidizing the surface of the silicon substrate with corona discharge treatment or plasma treatment in an oxygen-containing atmosphere.

The shape of the first region 11 provided on the substrate 1 may be determined according to the shape of the component 4 to be mounted on the first region 11. Preferably, the first region 11 has the same shape and size as a predetermined surface of the component 4 to be mounted (the surface that faces the substrate when mounted on the substrate). The surface of the component 4 has, for example, a polygonal shape such as a triangle, a quadrangle, or a hexagon, or a circular or elliptical shape. The phrase "having the same shape" means that the shape of the predetermined surface of the component to be mounted (that faces the substrate when mounted on the substrate) and the shape of the first region 11 are in a congruent or similar relationship in a mathematical sense.

The phrase "having the same size" means that the value of S2/S1 is in a range of 0.64 and 1.44 when S1 denotes the area of the predetermined surface of the component 4 to be mounted and S2 denotes the area of one first region 11. When the value of S2/S1 is smaller than 0.64, the amount of water to be disposed in the first region 11 is excessively small, which reduces the probability of disposing the component 4 there. When the value of S2/S1 is greater than 1.44, the amount of water to be disposed in the first region 11 is excessively large, which causes a plurality of components 4 to be disposed in one first region 11.

As an example, the second region 12 may be formed by a method of forming an organic film having a lower wettability than the first regions 11 and the lines 13 with respect to water (hereinafter also referred to as a water-repellent film) in at least a portion of the second region 12 on the substrate 1. Examples of such an organic film include a polymer film having fluoroalkyl chains, a film formed of a silane coupling agent or thiol molecules having fluoroalkyl chains, an organic-inorganic hybrid film having fluoroalkyl chains formed by a sol-gel method.

Examples of the polymer film having fluoroalkyl chains include polytetrafluoroethylene, polydifluoroethylene, and derivatives thereof. When a silane coupling agent is used to form the water-repellent film, the substrate may be immersed for a certain period of time in a solution of chloroform, alkane, alcohol, or silicone oil in which the silane coupling agent having fluoroalkyl chains is dissolved at a concentration of several vol %. In this case, the substrate that has been immersed in the solution subsequently may be washed with a solvent to form a monomolecular film. Preferably, the substrate on which any of these water-repellent film can be formed is a substrate having active hydrogen atoms on its surface. Examples of such a substrate include substrates made of silicon oxide, silicon nitride, stainless steel, copper, nickel, and surface-activated resin.

When thiol molecules are used to form the water-repellent film, the substrate may be immersed for a certain period of time in an ethanol or propanol solution in which thiol molecules having fluoroalkyl chains are dissolved at a concentration of several vol %, followed by washing with an alcohol. As a result, a water-repellent monomolecular film is formed. Examples of the substrate on which any of these monomolecular films can be formed include substrates made of metal such as gold, silver, and copper.

When the water-repellent film is formed by a sol-gel method, an alcohol solution in which, for example, tetraethoxysilane (a precursor of silicon oxide), alkoxysilane having fluoroalkyl chains, acid catalyst, and water are dissolved may be applied to the substrate by spin coating or dipping, followed by a heat treatment at or above 100° C. This water-repellent film can be formed on almost all kinds of substrates.

In Step (f), the water 21, the water 23, and the second liquid 3 are removed from the one main surface of the substrate 1. The components 4 are disposed in predetermined positions (first regions 11), irrespective of the order of removing the water 21, the water 23, and the second liquid 3.

The method of removing the water 21, the water 23, and the second liquid 3 is not particularly limited, and well-known drying methods can be used. A suitable drying method can be selected from well-known drying methods such as natural drying, drying in a vacuum desiccator, drying by blowing air or gas, drying by heating and/or under reduced pressure. Washing may be performed before drying.

Although a description has been given by taking water as a specific example of the first liquid 2, the first liquid 2 and the second liquid 3 may be selected appropriately in consideration of the interfacial tension that acts on the interface between the first liquid 2 and the second liquid 3 and the respective degrees of wettability of the first liquid 2 and the second liquid 3 with respect to the surface of the component 4.

A combination of the first liquid 2 and the second liquid 3 has to be selected so that the first liquid 2 is substantially insoluble in the second liquid 3. When the first liquid 2 is substantially insoluble in the second liquid 3, the first liquid 2 stays stably in the first region 11 even when the second liquid 3 (component-containing liquid 6) is in contact with the first liquid 2, and the resulting interfacial tension allows the component 4 to move into the first liquid 2. The first liquid 2 being "substantially insoluble in the second liquid 3" means that the solubility of the first liquid 2 in the second liquid 3 (the weight of the first liquid dissolved in 100 ml of the second liquid) is 10 g or less, and more preferably 1 g or less.

As such a combination of the first liquid 2 and the second liquid 3, for example, a combination of a high polarity first liquid 2 and a lower polarity second liquid 3 may be used.

A specific example of the first liquid 2 is water. The other examples of the first liquid 2 include alcohols such as methanol, ethanol, ethylene glycol, and glycerine, and a mixture of such an alcohol and water. Water is more suitable because it has a high surface tension and therefore enables the component 4 to be held firmly in the first region 11. Therefore, the first liquid 2 preferably contains water. In this case, the second liquid 3 preferably does not contain water.

Specific examples of the second liquid 3 include: alkanes such as hexane, heptane, octane, nonane, decane, undecane, dodecane, tridecane, tetradecane, pentadecane, and hexadecane; aromatic hydrocarbons such as toluene, benzene, and xylene; chlorinated solvents such as chloromethane, dichloromethane, chloroform, carbon tetrachloride, monochlorobutane, dichlorobutane, monochloropentane, and dichloropentane; ethers such as diethyl ether, and petroleum ether; esters such as ethyl acetate, and butyl acetate; silicone oil; perfluorooctane; perfluorononane; and mixtures of these. As the second liquid 3, a chlorinated solvent is used preferably.

For example, an organic solvent containing a hydrocarbon chain and an organic solvent containing a fluorocarbon chain also may be used as the first liquid 2 and the second liquid 3 respectively.

In this case, specific examples of the first liquid 2 include alkanes such as hexane, heptane, octane, nonane, decane, undecane, dodecane, tridecane, tetradecane, pentadecane, and hexadecane; and aromatic hydrocarbons such as toluene, benzene, and xylene.

Specific examples of the second liquid 3 include perfluorooctane and perfluorononane.

The material of the substrate 1 on which the component 4 is to be mounted is not particularly limited. A substrate formed of an inorganic material, a polymeric resin material, or a composite of an inorganic material and a polymeric resin material may be used. Examples of the inorganic material include ceramics such as alumina, silicon, and glass. Examples of the polymeric resin material include polyimide resin, polyamide resin, epoxy resin, and polycarbonate resin.

The composite of an inorganic material and a polymeric resin material is, for example, a composite material containing fibers made of glass, ceramic or metal, and a polymeric resin material. A SOI (Silicon On Insulator) substrate or a compound semiconductor substrate also may be used.

The fabrication method of the component 4 is not particularly limited, and well-known methods can be used. For example, a component fabrication method described in U.S. patent application Ser. No. 12/088,194 (now US Pat. No. 7,730,610) can be used. A step of surface-treating the components 4 so that the first liquid 2 has a higher wettability than the second liquid 3 with respect to the surfaces of the components 4 further may be provided prior to Step (d).

When a high-polarity liquid such as water is used as the first liquid 2, it is preferable that the component 4 have a higher surface energy, and the surface energy preferably is 40 mJ/m$^2$ or more. When the surface energy of the component 4 is low, it is preferable to treat the surface of the component 4 to increase its surface energy. When the component 4 has silicon on its surface, the surface may be irradiated with ultraviolet light in an ozone atmosphere to increase the surface energy. This method also is effective for electrode materials such as platinum, gold, copper, and nickel. Alternatively, a thin film having an affinity for the first liquid 2 (for example, a hydrophilic film when water is used as the first liquid 2) may be formed on the surface of the component 4 to increase the surface energy of the component 4. For example, a thin film of silicon oxide, silicon nitride, titanium oxide, or the like may be formed on the surface of the component 4 by vacuum sputtering or thermal CVD. Irradiation of ultraviolet light in an ozone atmosphere after the formation of the thin film is also effective. The surface energy of the component 4 also can be increased by modifying the surface of the component 4 with a silane coupling agent having an amino group, a carboxyl group, or a hydroxyl group at the terminal position. When the surface treatment is performed only on metals, a thiol having an amino group, a carboxyl group, or a hydroxyl group at the terminal position may be used for the surface modification.

When the first liquid 2 is an organic solvent containing a hydrocarbon chain, a thin film having a hydrocarbon chain is preferably formed on the surface of the component 4. Such an organic film can be formed by treating the component 4, for example, with a silane coupling agent having a hydrocarbon chain. As a result, the surface of the component 4 loses its polarity, becomes more wettable to the organic solvent containing a hydrocarbon chain and thus is easily drawn into the first liquid 2.

In the present embodiment, the lines 13 remain formed on one main surface of the substrate 1, but before or after the step of removing first liquid 2 and the second liquid 3, the region on the substrate 1 in which the lines 13 are formed may be cut by a well-known cutting method, for example, with a dicer.

Since the first regions 11 and the lines 13 having an affinity for the first liquid 2 are formed so that they are surrounded by the second region 12 having no affinity for the first liquid 2, as described above, the first liquid 2 can be disposed in the first regions 11 and the lines 13 accurately. As a result, the minute foreign objects 5 can be disposed in the lines 13, which allows the minute foreign objects 5 to be removed from the component-containing liquid 6. In addition, the components 4 can be disposed accurately in the first regions 11.

EXAMPLE

The following will describe a mounting method of the present invention in further detail by way of Example. The present invention is not limited in any way by this Example.

Example 1

In this Example, a mounting method of the present invention was used to mount silicon oxide on a substrate.

<Fabrication of Substrate on which Components are to be Mounted>

First, according to the method described in the embodiment, a pattern of hydrophilic regions (first regions and lines) surrounded by a water-repellent region (second region) was formed on a silicon substrate.

A silicon substrate with a thickness of 525 μm was subjected to plasma treatment in an oxygen-containing atmosphere to oxidize the surface of the substrate, and thus the surface was entirely made hydrophilic. Subsequently, a resist pattern corresponding to the first regions and the lines with the size to be described later was formed by photolithography. Next, in a dry atmosphere, the substrate on which the resist pattern was formed was immersed for 20 minutes in a perfluorooctane solution in which 1 vol % of $CF_3(CF_2)_7 C_2H_4SiCl_3$ was dissolved. After that, the substrate was washed in pure perfluorooctane, and then the solvent was removed. Then, the resist film was removed with acetone. Thus, a pattern of hydrophilic regions (first regions and lines)

surrounded by a water-repellent region (second region) was formed on the silicon substrate.

The substrate on which silicon oxide was to be disposed had a size of 20 mm long and 60 mm wide.

<First Regions in which Components are to be Mounted>

A pattern of hydrophilic regions as the first regions in which the components were to be mounted was formed over the entire surface of the substrate. In this pattern, rectangular regions, each measuring 10 μm in length and 50 μm in width, were arranged in a grid pattern with spacings of 100 μm in the width direction and 100 μm in the lengthwise direction. The first regions were formed so that the longitudinal direction thereof coincided with the longitudinal direction of the substrate.

<Lines for Removing Minute Foreign Objects>

A pattern of hydrophilic regions as the lines for removing minute foreign objects was formed. In this pattern, 300 linear regions, each measuring 15 mm in length and 5 μm in width, were arranged in parallel with a spacing of 100 μm. The lines were formed so that the transverse direction thereof coincided with the longitudinal direction of the substrate.

<Component-containing Liquid>

The component-containing liquid containing silicon oxide used as the components to be mounted was prepared by the method described in the embodiment.

First, an aluminum film with a thickness of 100 nm was formed on a silicon substrate with a thickness of 525 μm by electron beam evaporation. Subsequently, a silicon oxide film with a thickness of 200 nm was formed by plasma CVD. Rectangular resist patterns of 10 μm×50 μm were formed on the resulting substrate by photolithography. A part of the silicon oxide was removed by dry etching using the resist patterns as masks. Then, the remaining resist films were removed by plasma ashing treatment, and thus silicon oxide patterns (hereinafter referred to as a silicon oxide plates) of 10 μm long×50 μm wide×0.3 μm high were formed. Subsequently, the aluminum thin film was etched in a 47° C. mixture of phosphoric acid and nitric acid (hereinafter referred to as hot phosphoric acid) to lift off the silicon oxide plates.

Next, the silicon oxide plates dispersed in the hot phosphoric acid were subjected to suction filtration through a filter. The filter to which the silicon oxide plates adhered was dried overnight in a dry atmosphere, and then immersed for two hours in a 1,4-dichlorobutane solution in which 1 vol % of 1-chloroethyltrichlorosilane was dissolved. Suction filtration was carried out in a dry nitrogen atmosphere, and unreacted 1-chloroethyltrichlorosilane was removed by washing. Thus, silicon oxide plates with chemically-modified surfaces were obtained on the filter. This filter was immersed in 1,4-dichlorobutane and an ultrasonic wave was applied to disperse the silicon oxide plates that had adhered to the filter in 1,4-dichlorobutane. Thus, the component-containing liquid was obtained.

<Squeegee>

A slit-type squeegee (corresponding to the squeegee 41 shown in FIG. 4B, hereinafter referred to as a squeegee 41) made of SUS304 was used to dispose the first liquid (water was used in this Example) on the substrate. A 20 mm long and 0.5 mm wide slit (groove) for disposing the water was provided on the edge of the squeegee. Absorbent cotton was placed inside the slit to hold the water stably.

A knife-shaped squeegee (corresponding to the squeegee 42 shown in FIG. 4B, hereinafter referred to as a squeegee 42) made of polyethylene was used to dispose the second liquid (the above-mentioned component-containing liquid was used in this Example) on the substrate.

<Mounting Method>

The squeegee 41 and the squeegee 42 were placed, near the edge of the substrate on the side where the lines were formed, so that the edge surfaces of the squeegees became parallel to the transverse direction of the substrate. The squeegees 41 and 42 were placed so that they were moved on the substrate with a spacing of about 0.2 mm between the substrate and the edge surfaces of the squeegees. The distance between the squeegee 41 and the squeegee 42 was 1 mm.

Figure 7:
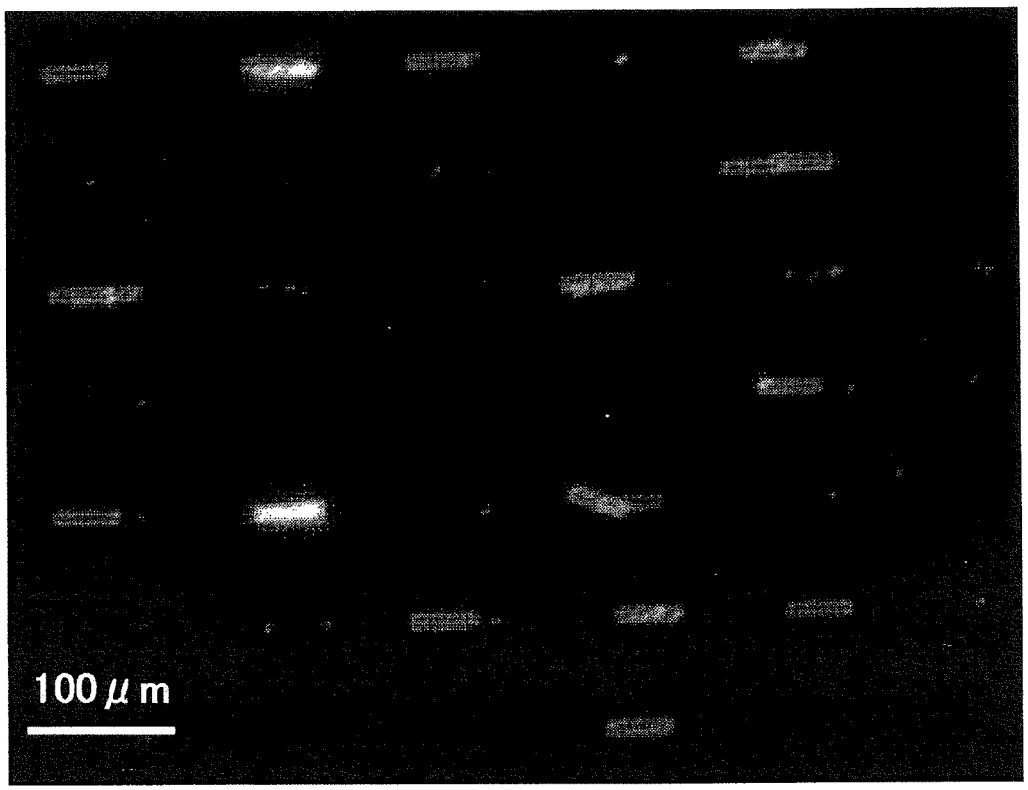
FIG. 7 is a micrograph of silicon oxide disposed on a substrate by a method of Example.

Next, about 50 μL of the silicon oxide plate-dispersed liquid was placed between the squeegee 42 and the substrate with a glass pipette, and the squeegee 42 was moved at a relative speed of 10 mm/sec. This procedure was repeated ten times. FIG. 7 is a micrograph taken after repeating this procedure. In this micrograph, 42 (7 rows and 6 columns) hydrophilic regions (first regions) are placed in a grid pattern. White rectangles are silicon oxide plates disposed in the hydrophilic regions, respective white circles and a series of white circles are minute foreign objects, and black area is a water-repellent region (second region). This micrograph shows that the silicon oxide plates are all disposed on the substrate in the same orientation.

Figure 8:
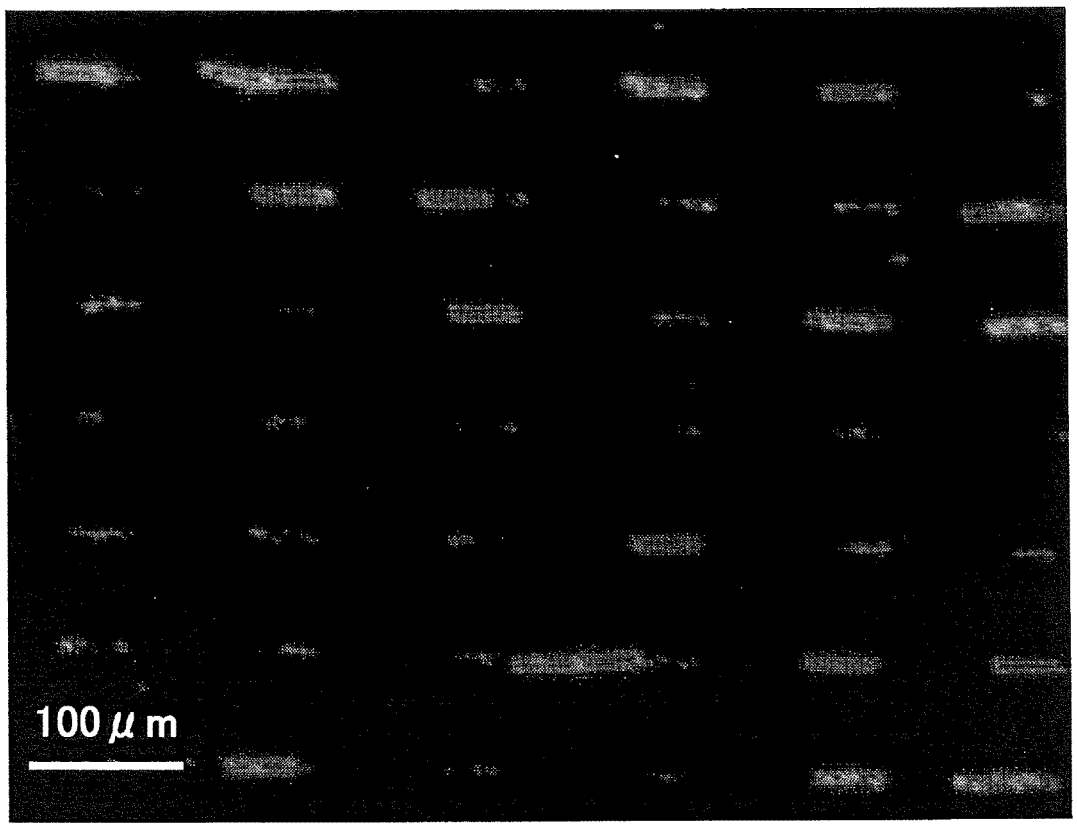
FIG. 8 is a micrograph of silicon oxide disposed on a substrate by a method of Comparative Example.

On the other hand, as Comparative Example, the same method as in the above-mentioned Example was carried out except that no lines were formed. That is, silicon oxide plates were mounted on a substrate on which no lines were formed. FIG. 8 is a micrograph taken after performing this procedure. In this micrograph, 42 (7 rows and 6 columns) hydrophilic regions (first regions) are placed in a grid pattern, as in the micrograph shown in FIG. 7.

The state in which the silicon oxide plates and minute foreign objects were disposed on the substrate was examined to evaluate the methods of Example and Comparative Example. Specifically, the number of hydrophilic regions Np in which the silicon oxide plates were disposed and the number of hydrophilic regions Nc in which the minute foreign objects were disposed were counted within an area including arbitrarily selected 42 hydrophilic regions on the substrate, and the evaluation was made based on the ratio Nc/Np. The methods were judged to be very good when the value of Nc/Np was in a range of 0 to less than 0.5, good when the value was in a range of 0.5 or more to less than 1.0, and poor when the value was 1.0 or more.

When the method of Example was used, after the tenth cycle, silicon oxide plates were disposed in 15 hydrophilic regions, among 42 regions, as shown in FIG. 7. Minute foreign objects were disposed in 3 regions. The value of Nc/Np was 0.2, which was judged to be very good.

On the other hand, when the method of Comparative Example was used, after the tenth cycle, silicon oxide plates were disposed in 16 hydrophilic regions, among 42 regions, as shown in FIG. 8. Minute foreign objects were disposed in 23 regions. The value of Nc/Np was 1.4, which was judged to be poor.

These results show that in the mounting method of the present invention, foreign objects smaller in volume than the components to be mounted (minute foreign objects) are removed in the lines, and therefore, the mounting method of the present invention is far superior to the method of Comparative Example as a method of reducing the probability of disposing the minute foreign objects in the first regions.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

A component mounting method according to the present invention can be applied when components including electronic devices are mounted or columnar micro components are mounted. This method can be applied to methods of fabricating electronic equipment and electronic devices. For example, this method can be applied to methods of fabricating circuit boards and electronic equipment including the circuit boards, and methods of repairing circuit boards and electronic equipment including the circuit boards.

What is claimed is:

1. A method of mounting a plurality of components on a substrate, comprising the steps of (a) to (f):
    (a) preparing the substrate comprising a plurality of first regions, a second region, and a line, wherein
        the second region surrounds the plurality of first regions and the line,
        the line is provided on a side of and along one edge of the substrate and has a shorter width than a minimum length of each of the components, and
        each of the first regions has the same shape and size as mounting surfaces of the components that are to be brought into contact with the substrate;
    (b) preparing a first liquid;
    (c) preparing a component-containing liquid containing the components and a second liquid, wherein
        the first liquid is insoluble in the second liquid and has a higher wettability than the second liquid with respect to the surfaces of the components, the first regions, and the line;
    (d) disposing the first liquid in the first regions and the line;
    (e) moving a squeegee relative to the substrate over the line from the one edge to the other edge of the substrate to bring the component-containing liquid into contact with the first liquid disposed in the first regions, the squeegee supplying the component-containing liquid to the substrate; and
    (f) removing the first liquid and the second liquid from the substrate to dispose the components in the first regions.

2. The component mounting method according to claim 1, wherein the first liquid is a liquid containing water, and the second liquid is a liquid containing no water.

3. The component mounting method according to claim 2, wherein the first liquid is water, and the second liquid is an organic solvent.

4. The component mounting method according to claim 3, wherein the organic solvent is a chlorinated solvent.

5. The component mounting method according to claim 1, wherein the first liquid has a higher wettability with respect to the first region than to the second region.

6. The component mounting method according to claim 1, wherein the first liquid has a higher wettability with respect to the line than to the second region.

7. The component mounting method according to claim 1, further comprising, prior to the step (d), a step of surface-treating the components so that the first liquid has a higher wettability than the second liquid with respect to the surfaces of the components.

8. The component mounting method according to claim 1, wherein the second liquid is less polar than the first liquid.

9. The component mounting method according to claim 1, wherein the first liquid contains an organic solvent having a hydrocarbon chain, and the second liquid contains an organic solvent having a fluorocarbon chain.

10. The component mounting method according to claim 1, wherein
    each of the components is a rectangular parallelepiped comprising a pair of surfaces (P1), a pair of surfaces (P2) each having an area equal to or larger than the surface (P1), and a pair of surfaces (P3) each having an area equal to or larger than the surface (P2),
    the surface (P3) and the first region have the same shape and size, and
    in the step (f), the components are disposed in the first regions so that one of the surfaces (P3) contacts a surface of the substrate on which the first regions are provided.

11. The component mounting method according to claim 10, wherein a short side of the surface (P3) of each of the components has a length of at least 10 μm, and a long side thereof has a length of not more than 1000 μm.

12. The component mounting method according to claim 1, wherein in the step (e), moving the squeegee relative to the substrate is one of moving the squeegee without moving the substrate; moving the substrate without moving the squeegee; and moving both of the squeegee and the substrate.

* * * * *